US006256996B1

(12) United States Patent
Ghoshal

(10) Patent No.: US 6,256,996 B1
(45) Date of Patent: Jul. 10, 2001

(54) NANOSCOPIC THERMOELECTRIC COOLERS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/458,272

(22) Filed: Dec. 9, 1999

(51) Int. Cl.[7] .............................. F25B 21/02; H01L 35/28
(52) U.S. Cl. ................................... 62/3.7; 62/3.3; 136/203
(58) Field of Search ............................... 62/3.7, 3.3, 159; 136/203, 204

(56) References Cited

U.S. PATENT DOCUMENTS

| 5,867,990 | 2/1999 | Ghoshal | 62/3.7 |
| 5,966,939 | * 10/1999 | Tauchi | 62/3.7 X |
| 5,966,941 | 10/1999 | Ghoshal | 62/3.7 |
| 6,000,225 | 12/1999 | Ghoshal | 62/3.7 |
| 6,100,463 | * 8/2000 | Ladd et al. | 136/205 X |

FOREIGN PATENT DOCUMENTS

| PCT/GB98/ 03412 | 12/1999 | (WO) . | |
| WO 00-08693 | 2/2000 | (WO) | H01L/35/34 |

OTHER PUBLICATIONS

Rinzler, A.G. et al.; Large–Scale Purification of Single–Wall Carbon Nanotubes: Process, Product and Characterization; 1998; pp. 29–37.
Liu, Jie et al.; Fullerene Pipes; Science; vol. 280; May 22, 1998; pp. 1253–1255.
Thess, Andreas et al.; Crystalline Ropes of Metallic Carbon Nanotubes; Science; vol. 273; Jul. 26, 1996; pp. 483–487.
Tubes @ Rice; Rice University; http://cnst.rice.edu/tubes/.
An Introduction to Thermoelectrics; http://www.tellurex.com/resource/introc.html.
Tellurex Corporation Frequently Asked Questions; http://www.tellurex.com/resource/txfaqc.html.

* cited by examiner

Primary Examiner—Corrine McDermott
Assistant Examiner—Chen-Wen Jiang
(74) Attorney, Agent, or Firm—Duke W. Yee; Casimer K. Salys

(57) ABSTRACT

Thermoelectric cooler for providing sub-ambient cooling and method of fabricating same. In one form, sub-micron thermoelectric coolers are formed using doped thin films as thermoelectric elements. The thin film thermoelectric elements are created on thermally and electrical isolating materials using an electrochemical deposition process with a junction formed between the thermoelectric elements. The sub-micron thermoelectric coolers can then be used to locally cool nanoscopic geometric regions such as regions of an integrated circuit or can be configured in an array for large scale microscopic cooling applications.

21 Claims, 5 Drawing Sheets ptionally # NANOSCOPIC THERMOELECTRIC COOLERS

FIELD OF THE INVENTION

The present invention relates to cooling apparatuses and methods for making same. More particularly, the invention is directed to sub-micron thermoelectric cooling apparatuses and configurations thereof.

BACKGROUND OF THE INVENTION

Sub-ambient cooling is conventionally accomplished through gas/liquid vapor phase compression based refrigeration cycles using Freon type refrigerants to implement the heat transfers. Such refrigeration systems are used extensively for cooling human residences, perishable items, and vehicles. Sub-ambient cooling is also often used with major electronic systems such as mainframe, server and workstation computers. Though vapor compression cooling can be very efficient, it does require significant moving hardware. Vapor compression cooling systems, at a minimum, include a compressor, a condenser, an evaporator, and related coolant transfer plumbing. As a result of the complexity and associated high cost, vapor compression cooling has not found material acceptance in small cooling applications, such as personal computers, integrated circuits, etc.

The fact that CMOS logic can operate significantly faster as the temperature decreases has been well known for many years. For example, when CMOS logic devices are operated at −50° C., their performance is improved by 50 percent over room temperature operation. Liquid nitrogen operating temperatures, in the range of −196° C., have shown 200 percent performance improvements. Similar benefits have been shown to accrue for integrated circuit wiring, where metal wiring resistance decreases by a factor of 2 for integrated circuits operated at −50° C. in comparison to room temperature operation. These performance improvements rival the recent technological breakthrough of using copper wiring in integrated circuits to reduce interconnect resistance and thereby effectively increase the operating frequencies attainable. Thus, sub-ambient temperature operation of integrated circuit logic devices, such as field effect transistors, as well as interconnect wiring can improve integrated circuit performance. This performance enhancement then poses the question of how to accomplish such cooling in the confines of the ever decreasing size and materially shrinking cost environment of microelectronics.

FIG. 1 schematically depicts a conventional Peltier type thermoelectric element (TE) 1 with DC power supply 2 creating the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - (1/2) I^2 R - K \Delta T \quad (1)$$

There presently exists a need for thin film implementations and minitarization of thermoelectric coolers. Thin film implementations and minitarization of thermoelectric coolers would provide high cooling flux scaling with the smaller geometries to provide cooling in the range of 50 W/cm$^2$ to 100 W/cm$^2$ with high entropy gradients and lower thermal conductivities. Use of thin film implementations would yield higher reliability in the order of MTBF (mean time between failures) of greater than 10$^6$ hours, lower cost in the order of less than 10¢/W and ease of constructing multistage configurations wherein menocoolers can be operated in parallel for large cooling capacity and high efficiency.

Thus, materials and processes presently used in fabricating current thermoelectric coolers limit the use, minitarization, scalability and efficiency of thermoelectric coolers for providing cooling creating a need to overcome these limitations.

SUMMARY OF THE INVENTION

The present invention overcomes the limitations of presently used thermoelectric cooler by providing sub-micron thermoelectric cooling apparatuses for cooling sub-micron geometric regions of objects and devices.

In one form, the invention relates to a thermoelectric cooling apparatus comprising a first thermoelectric cooling element, a second thermoelectric cooling element, and a junction coupled between the first and second thermoelectric cooling elements having a geometry of less than one micron.

In another form, the invention relates to a method of fabricating a thermoelectric cooling apparatus comprising the steps of forming a first thermoelectric cooling element having a contact region, forming a second thermoelectric cooling element having a contact region, and forming a junction coupling the first and second thermoelectric cooling elements having a geometry of less than one micron.

In a particularized form of the invention, a sub-micron thermoelectric cooler is provided having a thermally and electrically isolating substrate with defined sub-micron thermoelectric element and contact regions. Thin film semiconductor materials and contacts are deposited on the defined regions providing a sub-micron thermoelectric cooling apparatus.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures.

DETAILED DESCRIPTION OF A PREFERRED EMBODIMENT

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual ground work for the present invention involves using sub-micron semiconductor processes to form nanoscopic thermoelectric coolers for cooling sub-micron geometric regions. In this manner, the nanoscopic thermoelectric cooler, in one exemplary application, can be used to selectively cool small geometric regions of integrated electronic circuits thereby increasing the operating efficiency of the integrated electronic circuits.

Figure 1:
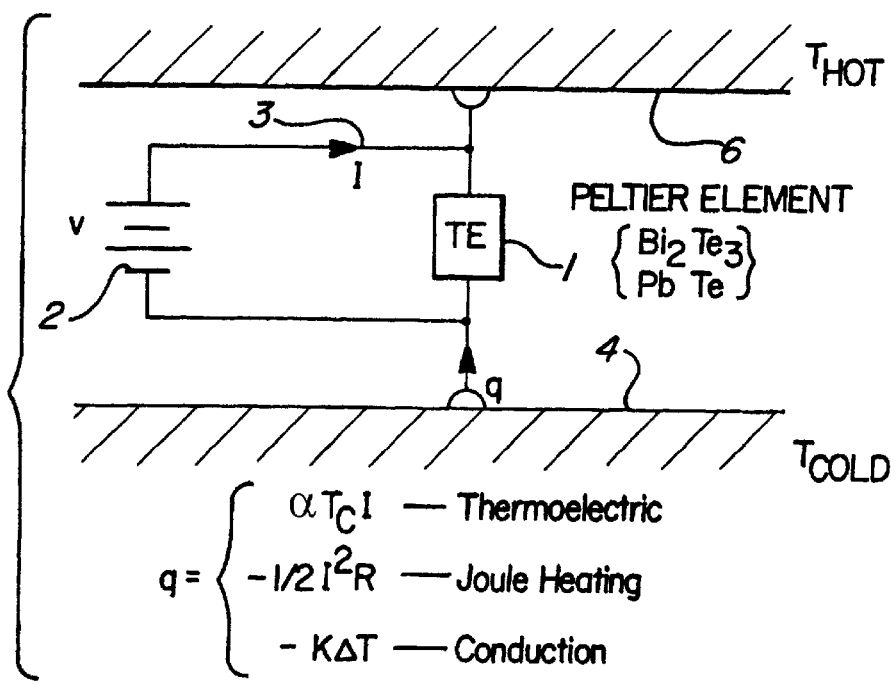
FIG. 1 schematically depicts a conventional statically operable Peltier device cooling system.
Figure 2A:
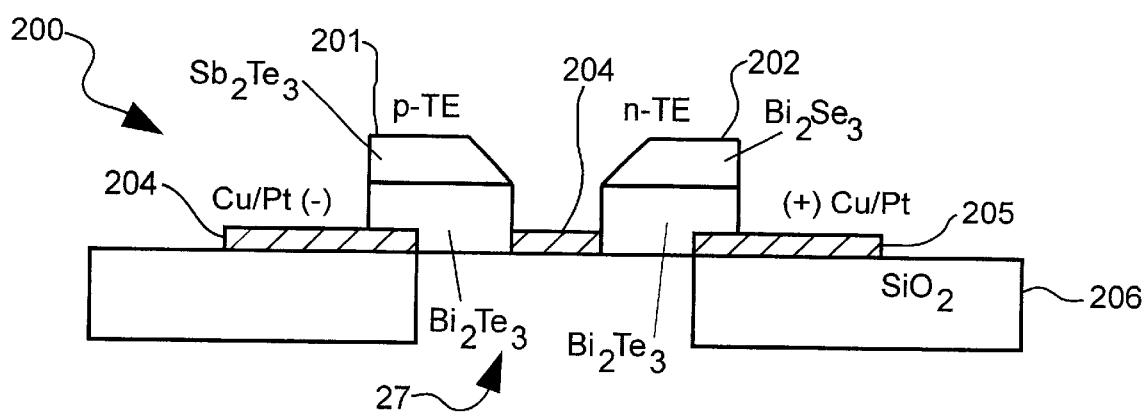
FIG. 2A illustrates a cross-sectional view of a thermoelectric cooling apparatus according to one embodiment of the present invention.

Referring to FIG. 2A, an illustration of a cross-sectional view of a thermoelectric cooling apparatus according to one embodiment of the present invention is shown. The cross sectional view illustrates thermoelectric cooling apparatus 200 having p-type thermoelectric element 201 and n-type thermoelectric element 202 coupled to thermal sinks/contacts 204 and 205, respectively, made of a Copper/Platinum plated material. Junction 203 is a sub- micron junction situated between and coupled to thermoelectric elements 201 and 202. Preferably, thermoelectric elements 201 and 202 are semiconductor materials created by electrochemically depositing doped thin films onto thermal sink 206. The thermoelectric material can be alloys or superlattices with effective composition $Bi_{0.5}Sb_{1.5}Te_3$ for p-type and $Bi_2Te_{0.9}Se_{0.4}$ for n-type. Thermal sinks 204 and 205 are positioned on a layer of silicon dioxide 206. Thermoelectric elements 201 and 202 and junction 203 are suspended across an etched out region 217 of layer 206. The layer of silicon dioxide 206 is etched away underneath thermoelectric elements 201 and 202 at region 217 to reduce parasitics and thermal conductivity. Silicon dioxide layer 206 may be etched using methods such as reactive ion etching or other well known etching methods. A portion of thermoelectric element 201 overlays thermal sink/contact 204 coupled to a negative voltage potential. Likewise, a portion of thermoelectric element 202 overlays thermal sink/contact 205 coupled to a positive voltage potential. During operation, the potential applied to thermoelectric cooling apparatus 200 creates a Peltier effect transferring thermal energy away from junction 203 towards contact 205 thereby providing cooling to sub-micron region associated with thermal sink 206.

Figure 2B:
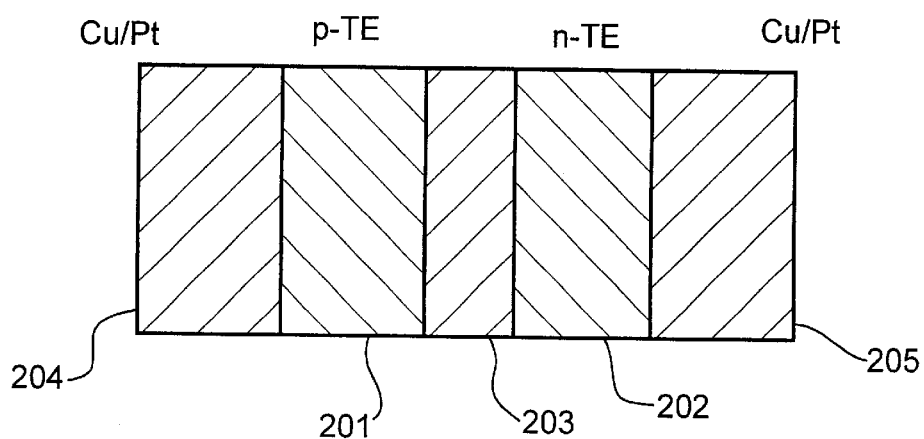
FIG. 2B schematically depicts a planar view of the thermoelectric cooling apparatus of FIG. 2A according to one embodiment of the present invention.

FIG. 2B schematically depicts a planar view of the thermoelectric cooling apparatus of FIG. 2A. Preferably, thermoelectric cooling apparatus 200 includes junction 203 positioned between and coupled to thermoelectric elements 201 and 202 and designed to geometries of less than one micron. In this manner, junction 203 can cool small geometric areas when placed over or coupled to sub-micron devices such as nanometer transistors and single electron transistors. Contacts 204 and 205 are coupled to thermoelectric elements 201 and 202 for providing a voltage source to thermoelectric cooling apparatus 200. Thermoelectric cooling apparatus 200 can be implemented using various semiconductor processes and may also be configured in many ways. For example, an array of sub-micron thermoelectric cooling apparatuses can be configured to cover a large area of a logic module within a large scale integrated circuit.

Figure 3A:
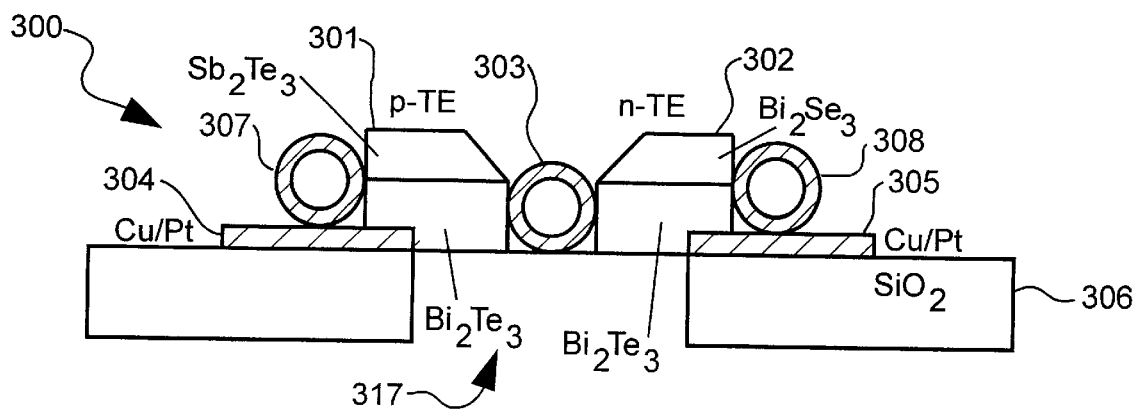
FIG. 3A illustrates a cross-sectional view of another thermoelectric cooling apparatus according to one embodiment of the present invention.

Referring now to FIG. 3A an illustration of a cross-sectional view of another thermoelectric cooling apparatus according to one embodiment of the present invention is shown. Thermoelectric cooling apparatus 300 is similar to thermoelectric cooling apparatus 200 and provides thermoelectric cooling to sub-micron geometric regions. Thermoelectric cooling apparatus 300 includes p-type thermoelectric element 301 and n-type thermoelectric element 302 made of doped thin film semiconductor materials as described in FIG. 2A above. Substrate 306 is made of a thin thermally and electrically insulating material such as silicon or silicon dioxide. Carbon nanotube 303 is situated between and coupled to thermoelectric elements 301 and 302 for providing an electrical and thermal contact between the thermoelectric elements and thermal sinks 304 and 305. Carbon nanotubes are single- wall fullerene nanotubes made by a process that includes laser vaporizing a carbon/Ni/Co mixture at 1200° C. The single-wall nanotubes are nearly uniform having an average diameter of 1.2 nm and organize into "ropes" that can be configured into carbon nanotube bundles. The "ropes" are metallic and have a lattice constant of 17 Å with a resistivity of approximately 0.0005 Ω-cm. Carbon nanotubes provide high entropy gradients and have high directional thermal conductivity, i.e. the thermal conductivity along the tube approaches that of diamond but conductivity in the normal direction or across the tube is very poor. Furthermore, electrons can tunnel across the nanotubes without dissipating significant energy. Carbon nanotubes are described in "Large-scale purification of single-wall carbon nanotubes: process, product, and characterization" by R. E. Smalley et al. herein incorporated by reference.

Thermal sink/contact 304 is made of a Copper/Platinum plated material and carbon nanotube 307 situated and coupled to the upper surface of thermal sink/contact 304 and the side wall of thermoelectric element 301. Likewise, thermal sink/contact 305 is made of a Copper/Platinum plated material having carbon nanotube 308 situated and coupled to the upper surface of thermal sink/contact 305 and the side wall of thermoelectric element 302. Carbon nanotubes 307 and 308 increase the efficiency of thermoelectric cooling apparatus 300 by taking advantage of the directional thermal conductivity of carbon nanotubes discussed above. Carbon nanotubes 303, 307, and 308 are positioned using AFM (atomic force microscope)-based processes such as described at www.research.ibm.com in the nanoscale science department. Carbon nanotubes 303, 307, and 308 are bonded to thermoelectric elements 301 and 302 by van der Waals forces. For positioning of carbon nanotubes and their bonding with surfaces see "Manipulation of individual carbon nanotubes and their interaction with surfaces" by T. Hertel, R. Martel, and Ph. Avouris. Journal of Physical Chemistry B 102, p. 910 (1998). Junction 303 being made of carbon nanotubes promotes direct transport and efficient recombination of electrons and holes between first and second thermoelectric elements 301 and 302, thus providing efficient thermoelectric cooling.

Figure 3B:
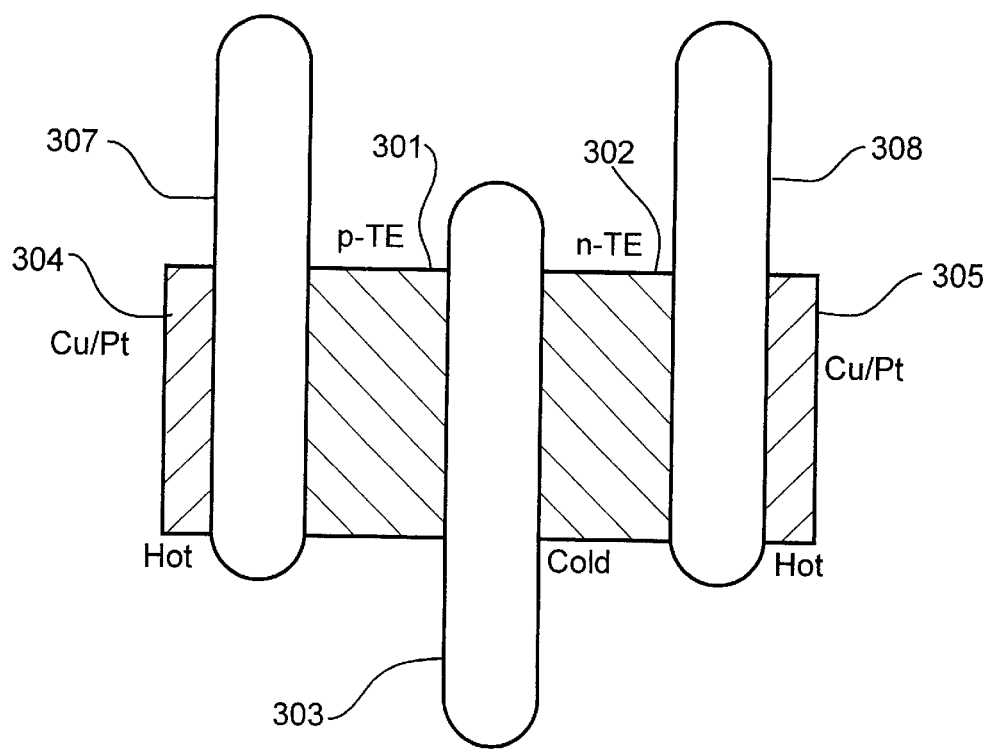
FIG. 3B illustrates a planar view of the thermoelectric cooling apparatus in FIG. 3A according to one embodiment of the present invention.

Referring now to FIG. 3B, an illustration of a planar view of the thermoelectric cooling apparatus in FIG. 3A is shown. The planar view of thermoelectric cooling apparatus 300 illustrates the defined regions of a sub-micron thermoelectric cooling apparatus having carbon nanotubes coupled to a nanoscopic thermoelectric cooling apparatus. During operation, carbon nanotubes 307 and 308 provide efficient energy transport between the thermoelectric elements and contacts 304 and 305. Contacts 304 and 305 are coupled to thermal sink 306 and are configured to be the hot ends of thermoelectric elements 301 and 302 for transferring thermal energy away from a small region of thermal sink 306 thus being configured as the cold end of thermoelectric cooling apparatus 300. Therefore, by utilizing carbon nanotubes having a diameter of approximately one nanometer, small geometric regions on the order of one nanometer can then be cooled.

Figure 4:
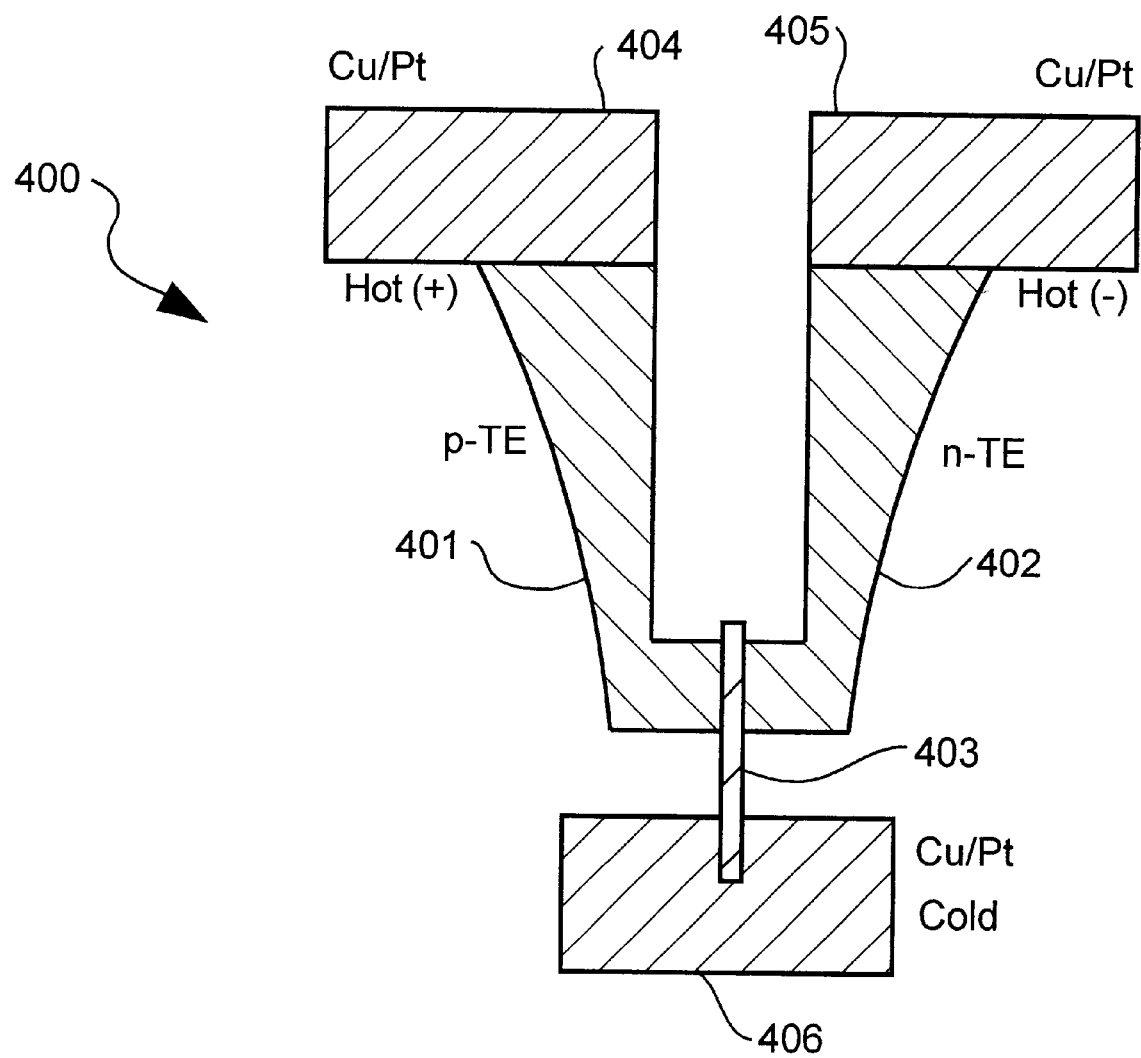
FIG. 4 schematically depicts a planar view of a shaped thermoelectric cooling apparatus according to one embodiment of the present invention.

FIG. 4 schematically depicts a planar view of a shaped thermoelectric cooling apparatus according to one embodiment of the present invention. Thermoelectric cooling apparatus 400 includes p-type thermoelectric element 401 and n-type thermoelectric element 402 made of doped thin film semiconductor materials as described above. The thermoelectric elements are shaped having a larger area at the hot end of thermoelectric cooling apparatus 400 and coupled to contacts 404 and 405 respectively. By providing thermoelectric elements with a larger area at the hot end, the overall transfer efficiency of thermal energy from the cold end of thermoelectric cooling apparatus 400 is increased. In the preferred embodiment, carbon nanotube 403 is positioned between and coupled to thermoelectric elements 401 and 402 for obtaining a high entropy gradient junction. Carbon nanotube 403 is also coupled to contact 406 and for providing efficient cooling to a sub-micron geometric region. During operation, a voltage is provided across contacts 404 and 405 for producing a Peltier effect such that a current flows through thermoelectric cooling apparatus 400. The current flows through contact 404 and thermoelectric element 401 to junction 403 and subsequently to thermoelectric element 402 and contact 405. As the current flows through junction 403, the energy state is altered when flowing from the n-type material to the p-type material, absorbing thermal energy. Therefore, carbon nanotube, being coupled to contact 406, absorbs thermal energy over a sub-micron geometric region. The current then continues to flow to contact 405 where thermal energy is dissipated. Though not shown, contacts 404, 405, and 406 are coupled to a thermal sink for dissipating and absorbing thermal energy.

Figure 5:
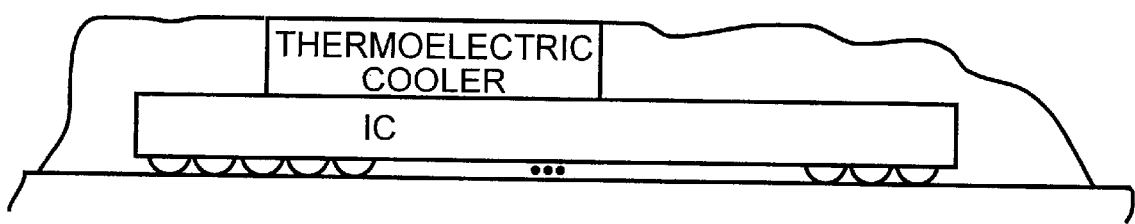
FIG. 5 schematically depicts the application of a small thermoelectric cooler to locally cool a selected part of an integrated circuit chip.

Referring now to FIG. 5, a schematic illustration of a sub-micron thermoelectric cooling apparatus coupled to an integrated circuit chip for purposes of selective sub-micron region cooling to control integrated circuit parameters is shown. Such localized or spot cooling applications are particularly useful for voltage controlled oscillators, phase detectors, mixers, low noise amplifiers, lasers, photodiodes, and various material type optoelectric circuits. This type of cooling can be extended cooling biochemical and molecular systems requiring cooling of sub-micron geometric regions.

In the following paragraphs, a preferred method of fabricating a sub-micron thermoelectric cooling apparatus according to present invention will be described.

First, a semiconductor wafer is prepared using conventional bulk CMOS processing techniques. The wafer is first oxidized to grow a layer of silicon dioxide onto the surface of the silicon wafer. After oxidation, a contact region is defined by first applying a layer of photoresist onto the silicon dioxide. Once the photoresist coating has been applied, a mask is used to selectively expose the photoresist enabling the undesired portions of photoresist to be removed from the areas of the wafer to be further processed. Exposure of the photoresist through the mask allows the developing process to take place. Developing involves the removal of the undesired photoresist to expose the silicon dioxide layer which was previously grown and still exists beneath the photoresist layer.

Contacts are created by depositing contact material, such as a Copper/Nickel alloy or a Copper/Platinum alloy in the preferred embodiment, using techniques such as chemical vapor deposition or sputtering, onto the exposed areas of the wafer being processed. This contact material deposition allows for the electrical connection of the thermoelectric elements used in thermoelectric cooling apparatus fabrication. The deposition of contact material causes a layer of contact material to be created on the entire surface of the wafer being processed, i.e., both the exposed areas of the wafer as well as those areas still covered by photoresist will contain contact material. The excess contact material is removed by applying a protective layer to the areas indicating the desired contact locations and then using a process similar to the masking, exposing, developing, and etching steps mentioned above. Once the excess contact material has been removed, the remaining photoresist is removed leaving only the silicon dioxide, a dielectric material, and the newly created contacts on the surface of the silicon wafer.

After the contacts are created, p-type and n-type thermoelectric elements are created by applying photoresist across the entire wafer and repeating the masking, exposing, and developing steps to define the p-type and n-type thermoelectric element regions. The p-type and n-type thermoelectric elements are then created by electrochemically depositing thin film semiconductor materials over the wafer's surface. For one example of electrodeposition of $Bi_2Te_3$ Films see "*Electrodeposition of $Bi_2Te_3$ Films*" by P. Magri, C. Boulanger and J. M. Lecuine. American Institute of Physics (AIP) Conference Proceedings 316, Thirteenth International Conference on Thermoelectrics, pp. 277–281 (1994), which is hereby incorporated by reference. Upon depositing the p-type and n-type thermoelectric elements, the excess photoresist is removed.

As briefly discussed previously, the $S_iO_2$ beneath the thermoelectric elements and junction is etched away using reactive ion etching (RIE) or other well known etching techniques.

The present invention has very broad applicability. The invention utilizes sub-micron semiconductor processes to provide nanoscopic thermoelectric cooling of sub-micron geometric regions of small objects and nanoscopic devices such as integrated electronic circuits.

It will be understood by those skilled in the art that the embodiments set forth hereinbefore are merely exemplary of the numerous arrangements for which the invention may be practiced, and as such may be replaced by equivalents without departing from the invention which will now be defined by appended claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A thermoelectric cooling apparatus comprising:
   a first thermoelectric cooling element;
   a second thermoelectric cooling element; and
   a junction coupled between said first and second thermoelectric cooling elements defining a localized region of cooling having a geometry of less than one micron.

2. The thermoelectric cooling apparatus, as recited in claim 1, wherein said thermoelectric cooling elements include a thin film semiconductor material.

3. The thermoelectric cooling apparatus, as recited in claim 1, wherein said thermoelectric cooling apparatus is configured to be a multiple staged thermoelectric cooling apparatus.

4. The thermoelectric cooling apparatus, as recited in claim 3, further comprising at least one thermal bridge coupled to at least one stage of said multiple staged thermoelectric cooling apparatus.

5. A thermoelectric cooling apparatus comprising:
   a first thermoelectric cooling element;
   a second thermoelectric cooling element; and
   a junction coupled between said first and second thermoelectric cooling elements having a geometry of less than one micron and composed of at least one carbon nanotube coupled to limit thermal, but not electrical, conduction between said first and second thermal cooling elements.

6. The thermoelectric cooling apparatus, as recited in claim 1, wherein said thermoelectric element is a Peltier device.

7. The thermoelectric cooling apparatus, as recited in claim 1, wherein said thermoelectric cooling apparatus is associated with at least one integrated circuit device.

8. The thermoelectric cooling apparatus, as recited in claim 7, wherein said integrated circuit device is a nanoelectronic integrated circuit device.

9. The thermoelectric cooling apparatus, as recited in claim 1, wherein said thermoelectric cooling apparatus is capable of providing nanoscopic cooling.

10. The thermoelectric cooling apparatus, as recited in claim 1, wherein said thermoelectric cooling apparatus is configured as a thermoelectric array.

11. A method of fabricating a thermoelectric cooling apparatus comprising the steps of:
    forming a first thermoelectric cooling element having a contact region;
    forming a second thermoelectric cooling element having a contact region; and
    forming a junction coupling the first and second thermoelectric cooling elements defining a localized region of cooling having a geometry of less than one micron.

12. The method, as recited in claim 11, further comprising the step of forming a thermal sink coupled to the junction.

13. The method, as recited in claim 11, further comprising the step of forming a multiple staged thermoelectric cooling apparatus.

14. The method, as recited in claim 13, further comprising the step of coupling a thermal bridge to at least one stage of the multiple staged thermoelectric cooling apparatus.

15. The method, as recited in claim 11, wherein the step of forming the first and second thermoelectric cooling elements includes forming a thin-film semiconductor material.

16. The method, as recited in claim 15, wherein the step of forming a thin-film semiconductor includes the step of electrochemically forming a thin-film semiconductor material.

17. A method of fabricating a thermoelectric cooling apparatus comprising the steps of:
    forming a first thermoelectric cooling element having a contact region;
    forming a second thermoelectric element having a contact region; and
    forming a junction coupling the first and second thermoelectric cooling elements having a geometry of less than one micron and composed of at least one carbon nanotube coupled to limit thermal, but not electrical, conduction between said first and second thermal cooling elements.

18. The method, as recited in claim 11, wherein said thermoelectric cooling apparatus is associated with at least one integrated circuit device.

19. The method, as recited in claim 11, wherein said integrated circuit includes at least one nanoelectronic device.

20. The method, as recited in claim 11, wherein said thermoelectric element is a Peltier device.

21. The method, as recited in claim 11, wherein said thermoelectric cooling apparatus is configured as a thermoelectric array.

* * * * *